(12) United States Patent
Masumoto

(10) Patent No.: US 12,488,995 B2
(45) Date of Patent: Dec. 2, 2025

(54) MANUFACTURING METHOD OF INSERT CASE FOR SEMICONDUCTOR DEVICE AND SEMICONDUCTOR DEVICE

(71) Applicant: Mitsubishi Electric Corporation, Tokyo (JP)

(72) Inventor: Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 796 days.

(21) Appl. No.: 17/341,625

(22) Filed: Jun. 8, 2021

(65) Prior Publication Data

US 2022/0165583 A1     May 26, 2022

(30) Foreign Application Priority Data

Nov. 20, 2020    (JP) ................................. 2020-193334

(51) Int. Cl.
    *B29C 45/14*       (2006.01)
    *B29C 39/10*       (2006.01)
    *H01L 21/52*       (2006.01)
    *H01L 21/56*       (2006.01)
                (Continued)

(52) U.S. Cl.
CPC .............. *H01L 21/52* (2013.01); *B29C 39/10* (2013.01); *B29C 45/14* (2013.01); *B29C 45/14196* (2013.01); *H01L 21/565* (2013.01); *H01L 23/057* (2013.01); *H01L 23/31* (2013.01)

(58) Field of Classification Search
CPC ........... B29C 2045/14098; B29C 2045/14139; B29C 2045/14147; B29C 45/14262; B29C 45/14073
See application file for complete search history.

(56) References Cited

U.S. PATENT DOCUMENTS

| | | | |
|---|---|---|---|
| 5,091,341 A * | 2/1992 | Asada | ..................... H01L 21/56 |
| | | | 257/E23.092 |
| 5,637,273 A * | 6/1997 | Goo | ...................... H01L 21/565 |
| | | | 264/272.17 |
| 6,521,983 B1 | 2/2003 | Yoshimatsu et al. | |

(Continued)

FOREIGN PATENT DOCUMENTS

| | | |
|---|---|---|
| DE | 101 01 078 A1 | 3/2002 |
| JP | H11333882 A * 12/1999 | ......... B29C 45/2608 |

(Continued)

OTHER PUBLICATIONS

An Office Action; "Notice of Reasons for Refusal," mailed by the Japanese Patent Office on Sep. 26, 2023, which corresponds to Japanese Patent Application No. 2020-193334 and is related to U.S. Appl. No. 17/341,625; with English language translation.

(Continued)

*Primary Examiner* — Matthew J Daniels

(74) *Attorney, Agent, or Firm* — Studebaker Brackett PLLC

(57) ABSTRACT

A manufacturing method of an insert case for a semiconductor device includes: placing a terminal inside a mold and fixing a central portion of the terminal by bringing a slide core into contact with the central portion of the terminal; with the central portion of the terminal fixed by the slide core, filling an inside of the mold with resin to mold an insert case; and separating the slide core from the terminal and taking out the insert case from the mold.

13 Claims, 9 Drawing Sheets

(51) Int. Cl.
*H01L 23/057* (2006.01)
*H01L 23/31* (2006.01)

(56) References Cited

U.S. PATENT DOCUMENTS

| | | | | |
|---|---|---|---|---|
| 2001/0030382 | A1* | 10/2001 | Lajza, Jr. | B29C 43/36 264/294 |
| 2006/0252384 | A1* | 11/2006 | Sugimoto | H05K 5/0034 455/90.3 |
| 2007/0165986 | A1* | 7/2007 | Sakurai | G02B 6/3644 385/88 |
| 2008/0012173 | A1* | 1/2008 | Asao | B29C 45/14639 425/117 |
| 2008/0253104 | A1* | 10/2008 | Inui | B29C 45/14655 361/813 |
| 2010/0297864 | A1* | 11/2010 | Matsuoka | H01R 43/24 439/271 |
| 2012/0112332 | A1* | 5/2012 | Minamio | H01L 23/4334 438/122 |

FOREIGN PATENT DOCUMENTS

| | | |
|---|---|---|
| JP | 2001-024012 A | 1/2001 |
| JP | 2004-022811 A | 1/2004 |
| JP | 2017-045771 A | 3/2017 |

OTHER PUBLICATIONS

An Office Action mailed by China National Intellectual Property Administration on Mar. 27, 2025, which corresponds to Chinese Patent Application No. 202111350498.0 and is related to U.S. Appl. No. 17/341,625.

An Office Action mailed by the German Patent and Trademark Office on Mar. 28, 2025, which corresponds to German Patent Application No. 102021120608.1 and is related to U.S. Appl. No. 17/341,625.

An Office Action mailed by China National Intellectual Property Administration on Jul. 31, 2024, which corresponds to Chinese Patent Application No. 202111350498.0 and is related to U.S. Appl. No. 17/341,625; with English language translation.

An Office Action mailed by China National Intellectual Property Administration on Dec. 12, 2024, which corresponds to Chinese Patent Application No. 202111350498.0 and is related to U.S. Appl. No. 17/341,625; with English language translation.

An Office Action mailed by China National Intellectual Property Administration on Aug. 28, 2025, which corresponds to Chinese Patent Application No. 202111360498.0 and is related to U.S. Appl. No. 17/341,625; with English language translation.

* cited by examiner

MANUFACTURING METHOD OF INSERT CASE FOR SEMICONDUCTOR DEVICE AND SEMICONDUCTOR DEVICE

BACKGROUND OF THE INVENTION

Field

The present disclosure relates to a manufacturing method of an insert case for a semiconductor device and a semiconductor device.

Background

An insert case molded by placing terminals inside a mold and filling the mold with a resin is used as a case for a semiconductor device. A technology of holding end portions of the terminals with guide pins provided at the mold upon insert molding is disclosed (see, for example, JP 2004-22811 A (FIG. 10 and FIG. 11)).

SUMMARY

With the related art, it is possible to prevent the end portions of the terminals fixed with the mold from moving or being deformed by flow of the resin. However, central portions of the terminals which are not fixed with the mold move or are deformed by being affected by the flow of the resin, which makes moldability of the insert case unstable. Thus, a problem that reliability degrades arises, such as occurrence of malfunctions of the semiconductor device due to an insufficient insulation distance between the terminals.

The present disclosure has been made to solve the problem as described above and is directed to providing a manufacturing method of an insert case for a semiconductor device which can improve reliability and the semiconductor device.

A manufacturing method of an insert case for a semiconductor device according to the present disclosure includes: placing a terminal inside a mold and fixing a central portion of the terminal by bringing a slide core into contact with the central portion of the terminal; with the central portion of the terminal fixed by the slide core, filling an inside of the mold with resin to mold an insert case; and separating the slide core from the terminal and taking out the insert case from the mold.

In the present disclosure, insert molding is performed in a state where the central portion of the terminal is fixed by bringing the slide core into contact with the central portion of the terminal. This can prevent the terminal from being deformed and moving by flow of the resin, so that moldability of the insert case becomes stable. This can result in improvement of reliability of the insert case and the semiconductor device.

Other and further objects, features and advantages of the invention will appear more fully from the following description.

DESCRIPTION OF EMBODIMENTS

A manufacturing method of an insert case for a semiconductor device and a semiconductor device according to the embodiments of the present disclosure will be described with reference to the drawings. The same components will be denoted by the same symbols, and the repeated description thereof may be omitted.

First Embodiment

Figure 1:
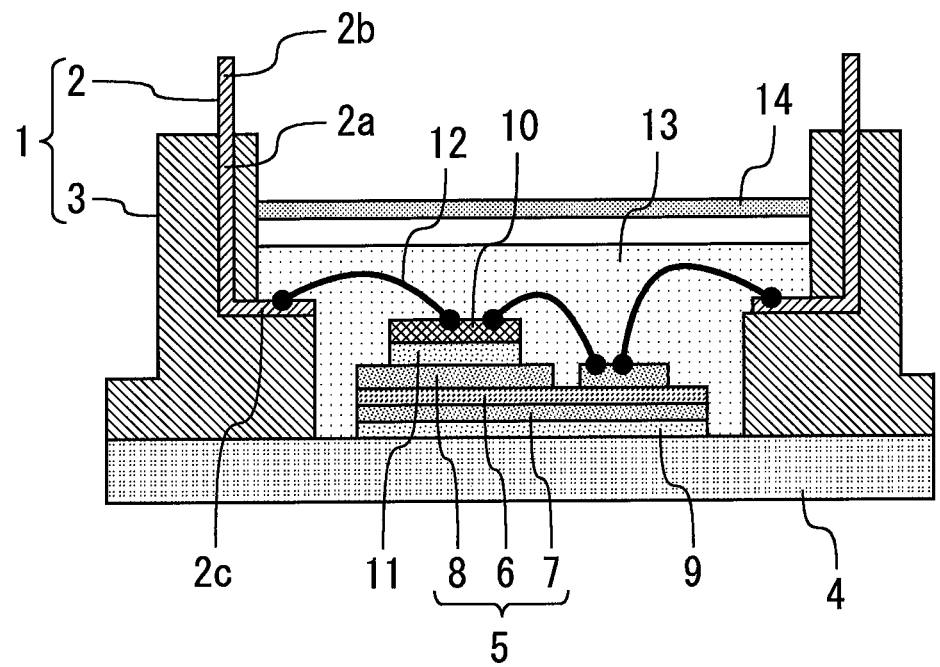
FIG. 1 is a cross-sectional view illustrating a semiconductor device according to a first embodiment.
Figure 2:
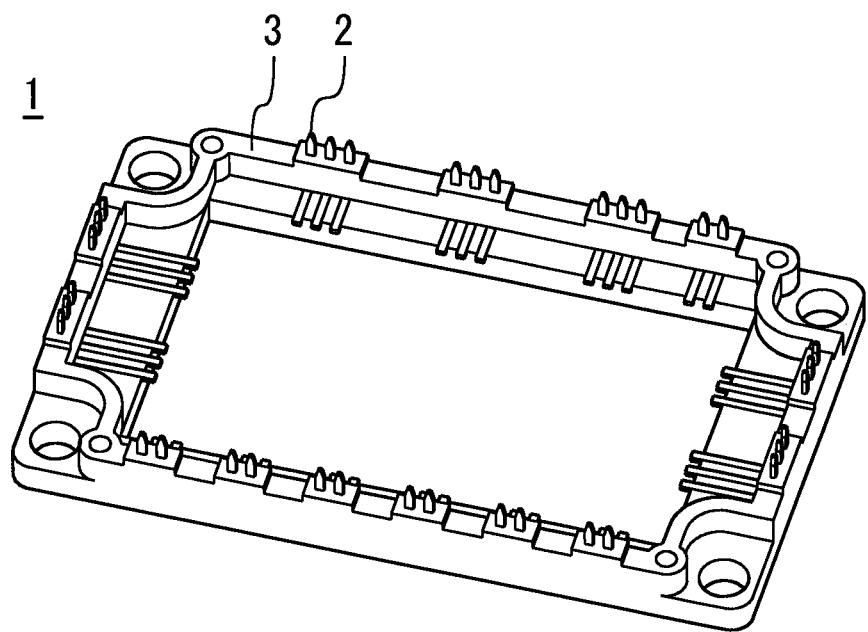
FIG. 2 is a perspective view illustrating an insert case according to the first embodiment.

FIG. 1 is a cross-sectional view illustrating a semiconductor device according to a first embodiment. FIG. 2 is a perspective view illustrating an insert case according to the first embodiment. An insert case 1 includes a plurality of terminals 2 and a resin 3 which covers central portions 2a of the plurality of terminals 2. The plurality of terminals 2 are arranged in parallel to each other. The terminals 2 bend into an L shape. One end portion 2b of each of the terminals 2 projects above the insert case 1. The other end portion 2c of the terminal 2 projects toward inside of the insert case 1.

The insert case 1 is bonded to an upper surface of a metal base plate 4. An insulating substrate 5 is provided on the base plate 4 inside the insert case 1. The insulating substrate 5 includes a ceramic plate 6, a metal pattern 7 provided on a lower side of the ceramic plate 6, and a circuit pattern 8 provided on an upper side of the ceramic plate 6. The metal pattern 7 of the insulating substrate 5 is bonded to the base plate 4 with solder 9.

A semiconductor chip 10 is bonded to the circuit pattern 8 of the insulating substrate 5 with solder 11 and is mounted on the insert case 1. An upper electrode of the semiconductor chip 10 is connected to the end portion 2c of the terminal 2 exposed from the resin 3 with a wire 12. The insulating substrate 5, the semiconductor chip 10 and the wire 12 are sealed with a seal material 13 such as gel inside the insert case 1. A lid 14 is provided on the insert case 1.

Figure 3:
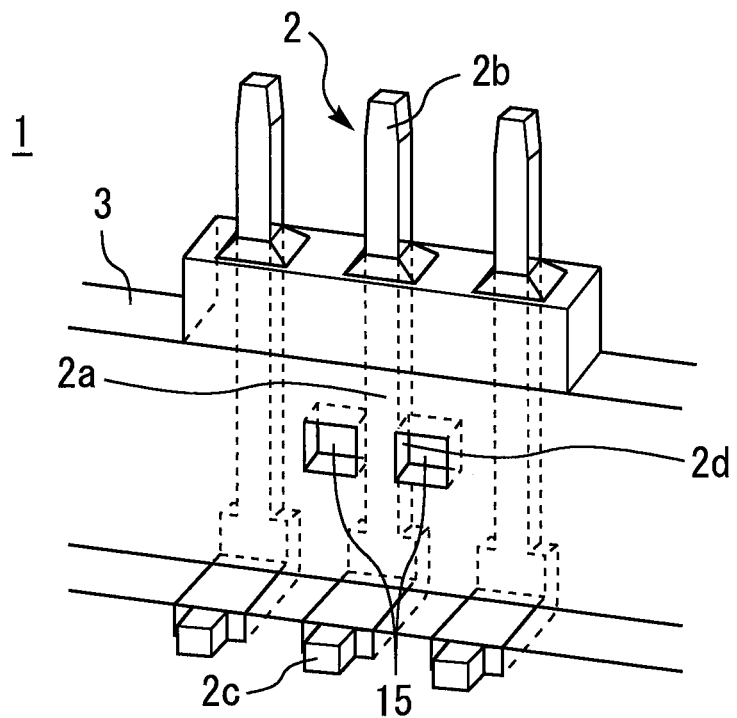
FIG. 3 is an enlarged perspective view of an internal surface of the insert case according to the first embodiment.

FIG. 3 is an enlarged perspective view of an internal surface of the insert case according to the first embodiment. The terminal 2 includes a side surface 2d facing the adjacent terminal 2. Two holes 15 are provided on the internal surface of the insert case 1 so that the central portion 2a of one terminal 2 is sandwiched between the holes. The side surface 2d of the terminal 2 is exposed from the resin 3 through the holes 15. The holes 15 do not reach an external surface and do not pass through a side wall of the insert case 1.

Figure 5:
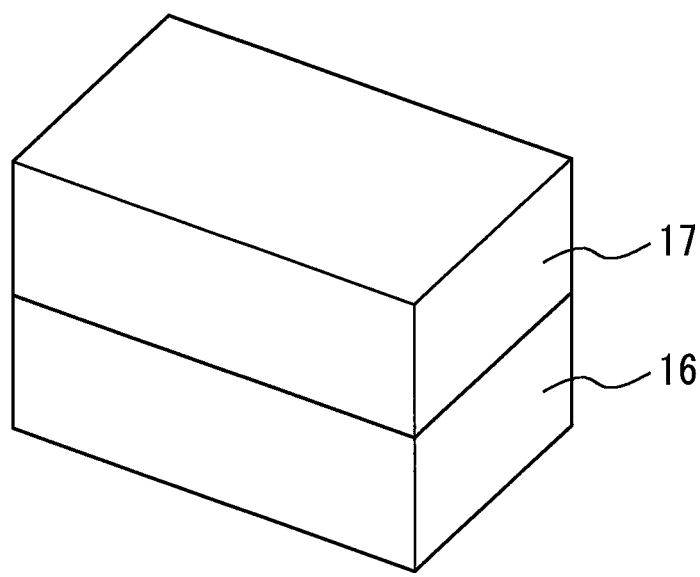
FIG. 5 is a perspective view illustrating the manufacturing process of the insert case according to the first embodiment.
Figure 6:
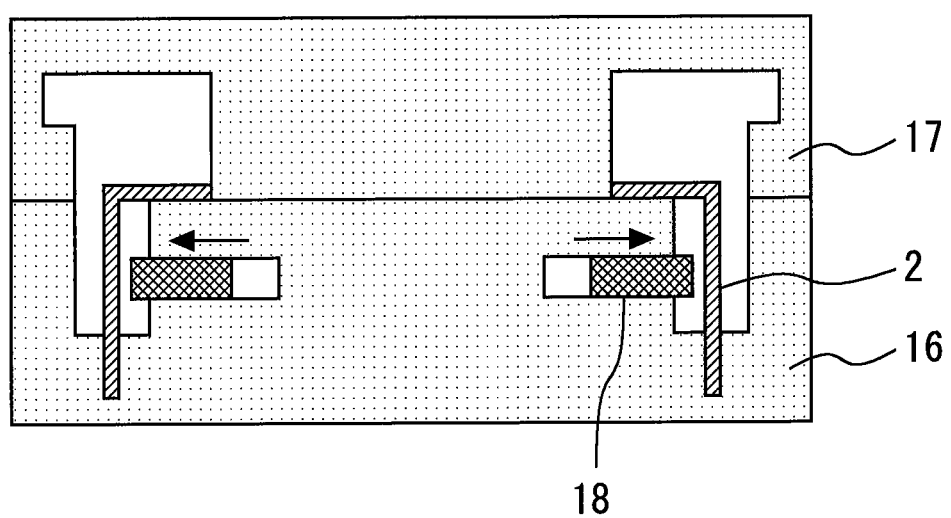
FIG. 6 is a cross-sectional view illustrating the manufacturing process of the insert case according to the first embodiment.

Subsequently, a manufacturing method of the insert case for the semiconductor device according to the present embodiment will be described. FIGS. 4, 5 and 7 to 10 are perspective views illustrating the manufacturing process of the insert case according to the first embodiment. FIG. 6 is a cross-sectional view illustrating the manufacturing process of the insert case according to the first embodiment.

Figure 4:
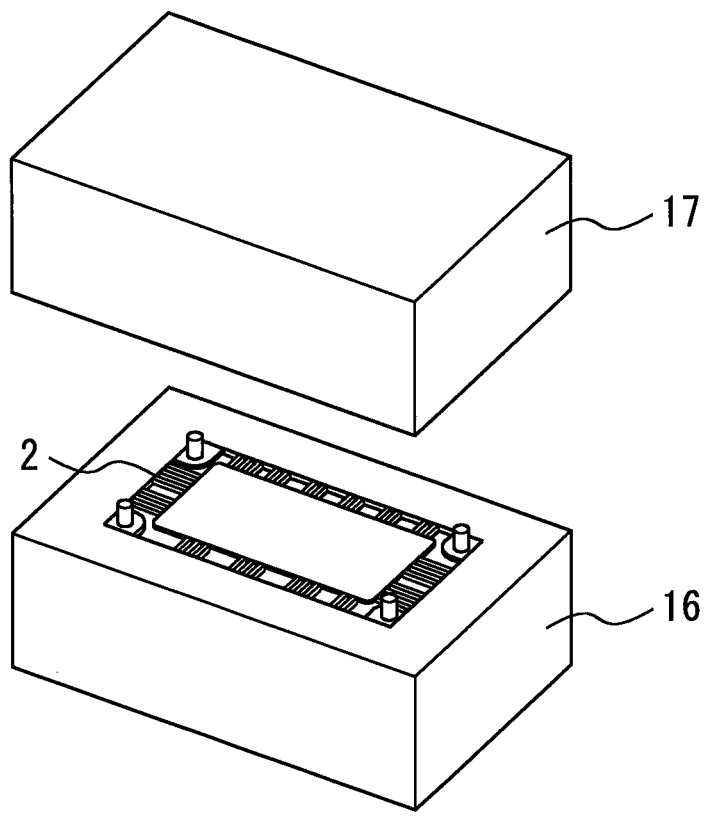
FIG. 4 is a perspective view illustrating the manufacturing process of the insert case according to the first embodiment.
Figure 7:
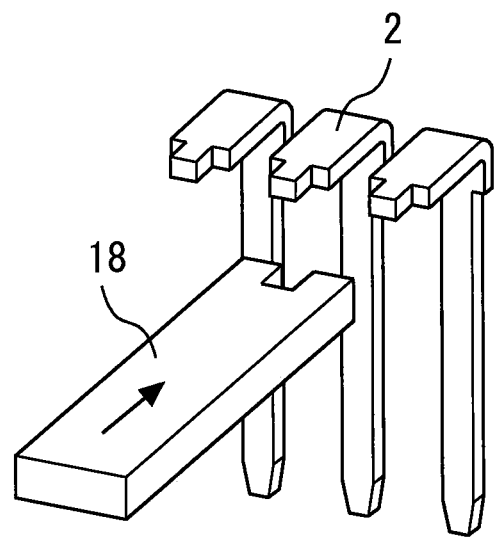
FIG. 7 is a perspective view illustrating the manufacturing process of the insert case according to the first embodiment.
Figure 8:
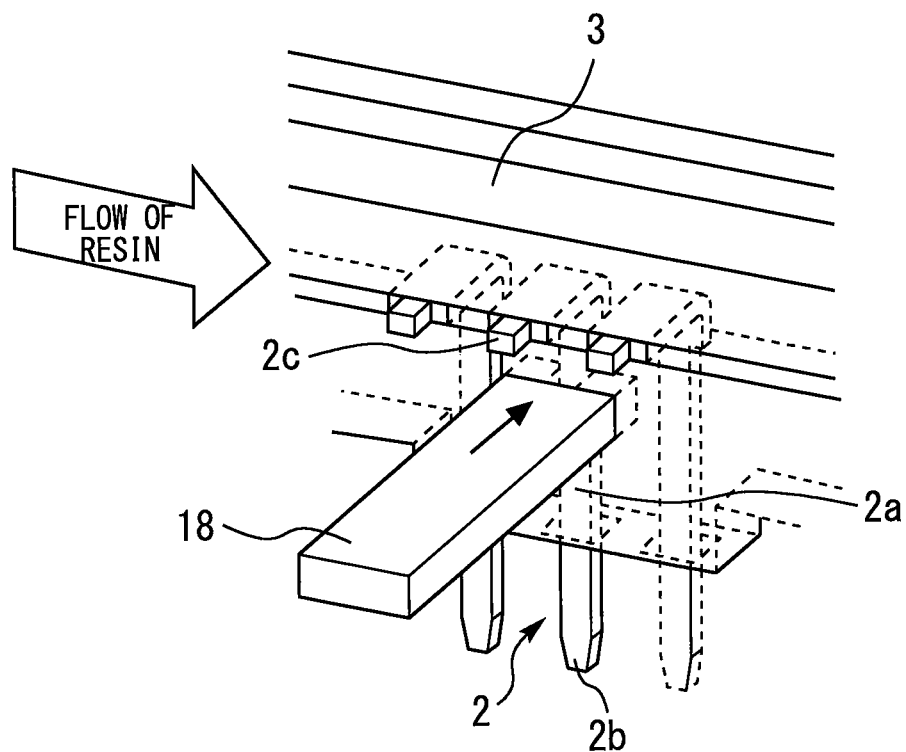
FIG. 8 is a perspective view illustrating the manufacturing process of the insert case according to the first embodiment.

First, as illustrated in FIG. 4, a plurality of terminals 2 are placed inside a mold 16. Then, as illustrated in FIG. 5, a mold 17 is placed on the mold 16, and the molds 16 and 17 are closed. In this event, as illustrated in FIGS. 6 and 7, slide cores 18 laterally move toward the terminals 2 inside the molds 16 and 17. Then, as illustrated in FIG. 8, a central portion 2a of the terminal 2 is sandwiched between two projections of tips of the slide core 18, and the slide core 18 is brought into contact with the side surface 2d of the central portion 2a of the terminal 2, so that the central portion 2a of the terminal 2 is fixed. The inside of the molds 16 and 17 is filled with the resin 3 in this state to mold the insert case 1.

Figure 9:
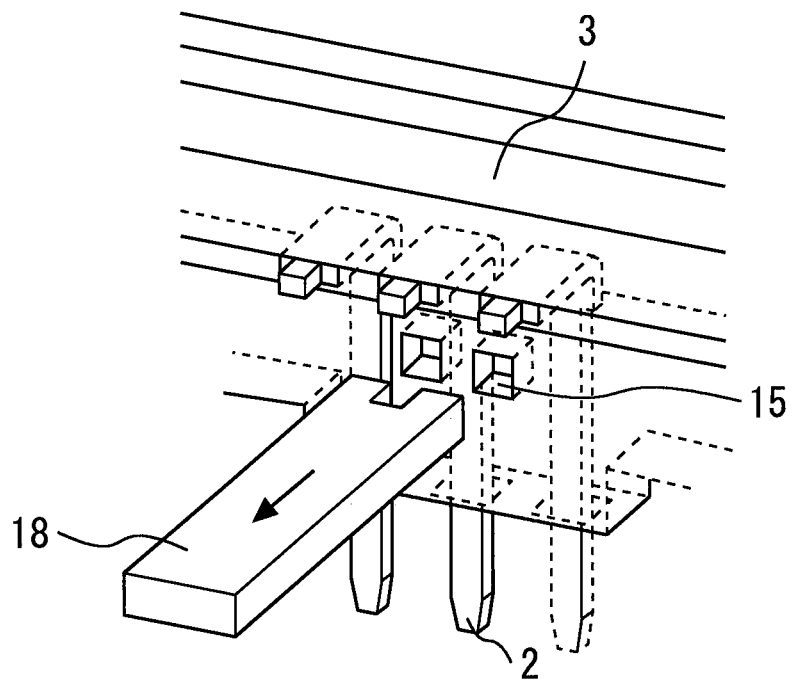
FIG. 9 is a perspective view illustrating the manufacturing process of the insert case according to the first embodiment.
Figure 10:
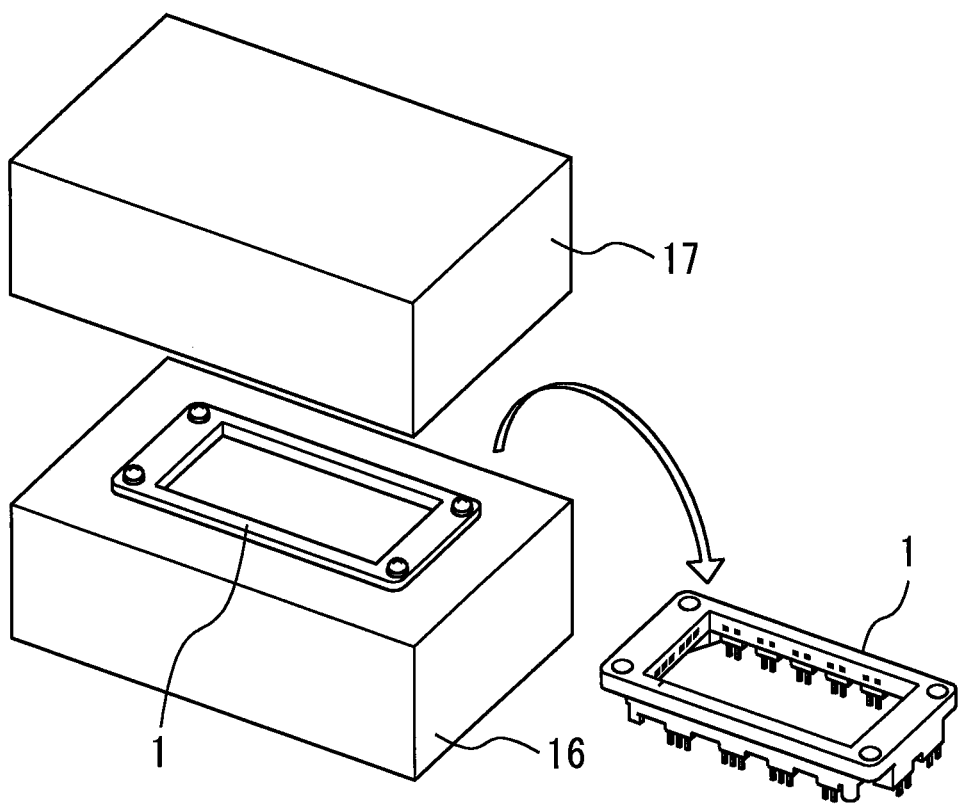
FIG. 10 is a perspective view illustrating the manufacturing process of the insert case according to the first embodiment.

Next, as illustrated in FIG. 9, when the molds 16 and 17 are open, the slide core 18 is laterally moved to separate the slide core 18 from the terminal 2. Then, as illustrated in FIG. 10, the insert case 1 is taken out from the mold 16. Note that the slide core 18 is configured to move at the same time as opening and closing of the molds 16 and 17, that is, upward and downward movement of the upper mold 17.

In the insert molding described above, when the terminals 2 are placed inside the molds 16 and 17, end portions 2b and 2c of the terminals 2 are fixed with the molds 16 and 17. However, in a case where a side wall of the insert case 1 is thin, only fixing of the end portions 2b and 2c of the terminals 2 cannot prevent the central portions 2a of the terminals 2 from being deformed or moving by flow of the resin regardless of a position where an inlet of the resin is provided at the molds 16 and 17.

Thus, in the present embodiment, insert molding is performed in a state where the central portions 2a of the terminals 2 are fixed by bringing the slide cores 18 into contact with the central portions 2a of the terminals 2. This can prevent the terminals 2 from being deformed and moving by flow of the resin, so that moldability of the insert case becomes stable. This can result in improvement of reliability of the insert case 1 and the semiconductor device. Note that holes 15 are provided on an internal surface of the molded insert case 1 because insert molding is performed while the slide cores 18 are brought into contact with the terminals 2.

Further, two projections of tips of the slide core 18 are inserted between adjacent terminals 2. This restricts movement of the terminals 2 in a direction of an interval between the terminals 2, so that it is possible to prevent a malfunction of the semiconductor device due to an insufficient insulation distance between the terminals 2.

Second Embodiment

Figure 11:
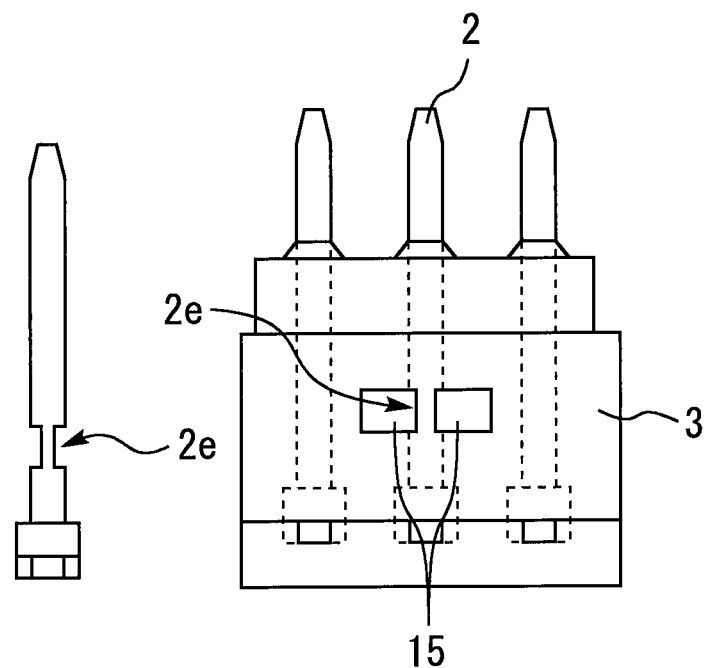
FIG. 11 is an enlarged side view of a terminal and an internal surface of an insert case according to a second embodiment.
Figure 12:
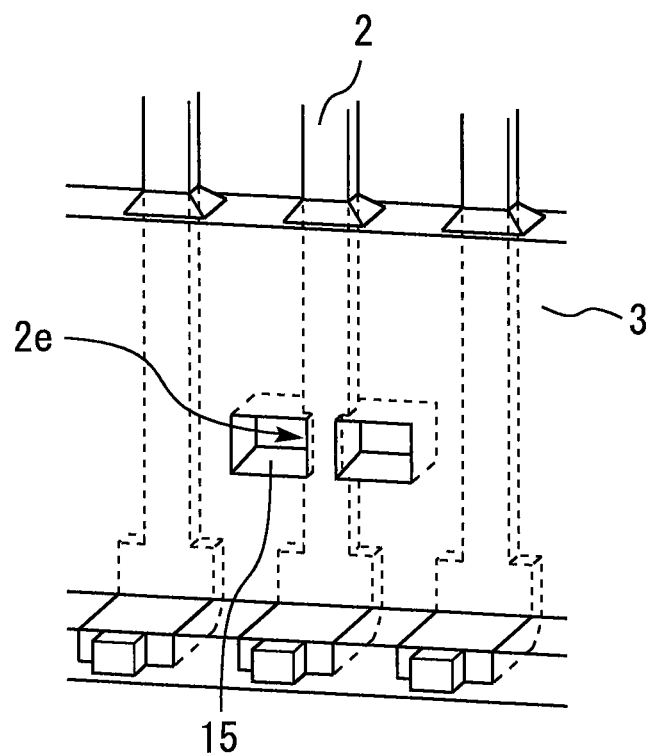
FIG. 12 is an enlarged perspective view of the internal surface of the insert case according to the second embodiment.

FIG. 11 is an enlarged side view of a terminal and an internal surface of an insert case according to a second embodiment. FIG. 12 is an enlarged perspective view of the internal surface of the insert case according to the second embodiment. Cutouts 2e are provided at the central portion 2a of the terminal 2. The holes 15 are provided along the cutouts 2e. The slide core 18 is inserted into the cutouts 2e upon insert molding. This can fix the terminal 2 more firmly, so that it is possible to improve an effect of preventing the terminal 2 from being deformed by flow of the resin. Other configurations and effects are similar to those in the first embodiment.

Third Embodiment

Figure 13:
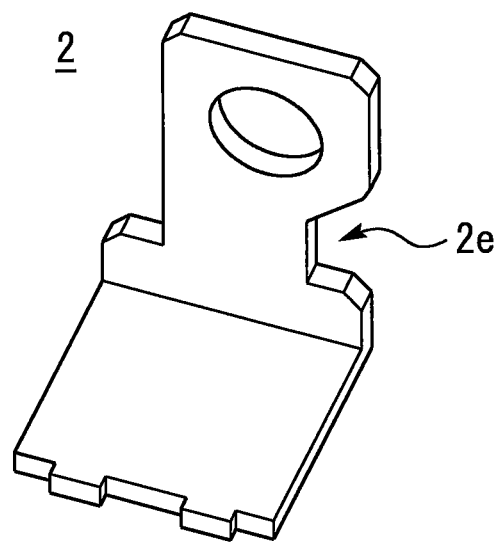
FIG. 13 is a perspective view illustrating a terminal according to a third embodiment.
Figure 14:
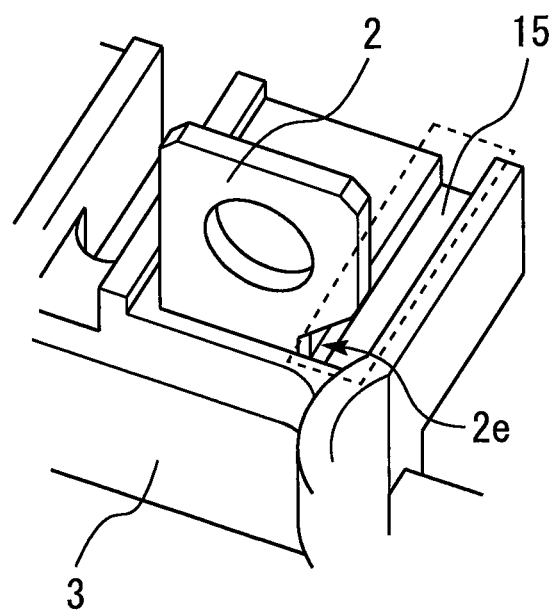
FIG. 14 is an enlarged perspective view of part of an insert case according to the third embodiment.

FIG. 13 is a perspective view illustrating a terminal according to a third embodiment. FIG. 14 is an enlarged perspective view of part of an insert case according to the third embodiment. A portion of the terminal 2 where a cutout 2e is provided extends to outside of the resin 3 of the insert case 1. The hole 15 provided along the cutout 2e forms a groove outside the insert case 1.

Figure 15:
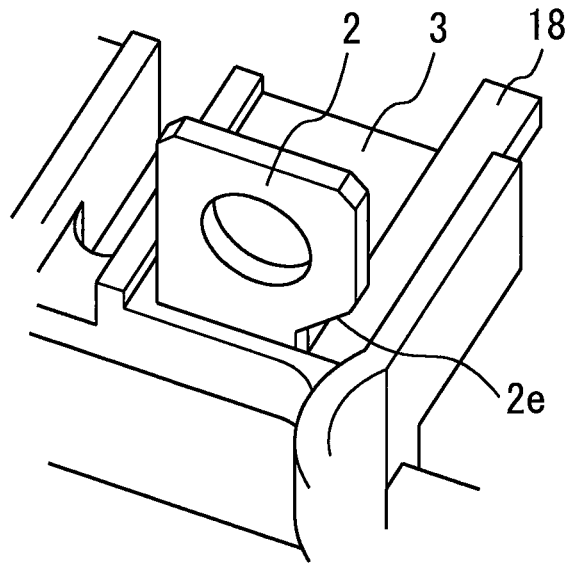
FIG. 15 is a perspective view illustrating an aspect upon molding of the insert case according to the third embodiment.
Figure 16:
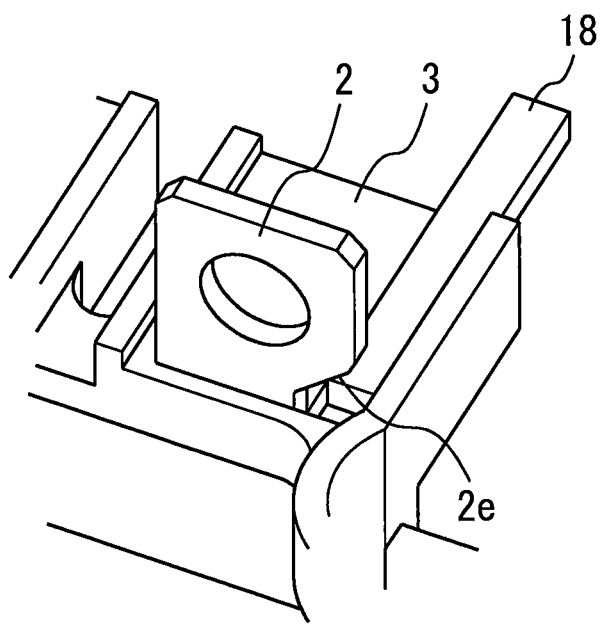
FIG. 16 is a perspective view illustrating an aspect upon molding of the insert case according to the third embodiment.

FIG. 15 and FIG. 16 are perspective views illustrating an aspect upon molding of the insert case according to the third embodiment. As illustrated in FIG. 15, the insert case 1 is molded by filling inside of the molds 16 and 17 with the resin 3 in a state where the slide core 18 is inserted into the cutout 2e. When the molds 16 and 17 are open, as illustrated in FIG. 16, the slide core 18 is laterally moved to separate the slide core 18 from the terminal 2.

Figure 17:
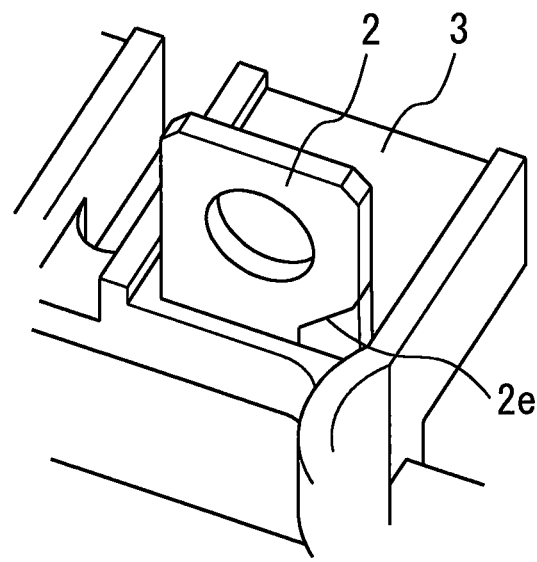
FIG. 17 is an enlarged perspective view of part of an insert case according to the comparative example.
Figure 18:
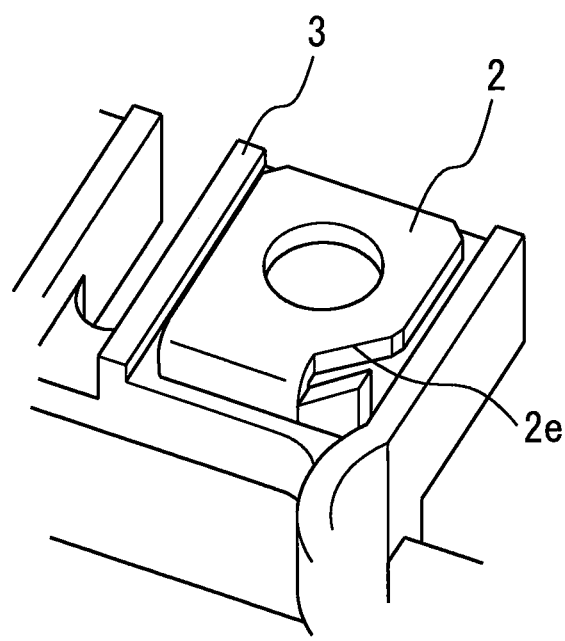
FIG. 18 is an enlarged perspective view of part of an insert case according to the comparative example.

Effects of the present embodiment will be described compared to a comparative example. FIG. 17 and FIG. 18 are enlarged perspective views of part of an insert case according to the comparative example. FIG. 18 illustrates a state where the terminal 2 is bent. In the comparative example, the cutout 2e is filled with the resin 3 as illustrated in FIG. 17 because the slide core 18 is not inserted into the cutout 2e upon insert molding. Thus, postprocessing work of removing the resin is required. In contrast, in the present embodiment, it is possible to prevent the cutout 2e from being filled with the resin 3 by inserting the slide core 18 into the cutout 2e. It is therefore possible to save trouble of postprocessing work. Other configurations and effects are similar to those of the second embodiment.

The semiconductor chip 10 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Further, in a case where a semiconductor chip 10 formed with silicon carbide is used, a PCB substrate on which a short-circuit protection circuit is mounted is often built into the semiconductor device. In this case, the number of terminals 2 to be inserted into a case to be connected to the PCB substrate increases. It is therefore further effective to prevent a malfunction of the semiconductor device due to an insufficient insulation distance between the terminals 2 by the above-described embodiment.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-193334, filed on Nov. 20, 2020 including specification, claims, drawings and summary, on which the convention priority of the present application is based, is incorporated herein by reference in its entirety.

The invention claimed is:

1. A manufacturing method of an insert case for a semiconductor device comprising:
    placing a terminal inside a mold and fixing a central portion of the terminal by bringing a slide core into contact with the central portion of the terminal;
    with the central portion of the terminal fixed by the slide core, filling an inside of the mold with resin to mold an insert case to embed a portion of the slide core in the molded insert case; and
    separating the slide core from the terminal and the case and taking out the insert case from the mold, wherein
    the terminal includes a plurality of terminals arranged in parallel to each other, and the slide core is inserted between the adjacent terminals, and
    the mold is configured such that when taking out the insert case from the mold, the insert case has a frame shape surrounding a hollow interior, and the terminal is exposed from respective sides of the insert case.

2. The manufacturing method of an insert case for a semiconductor device according to claim 1, wherein when the terminal is placed inside the mold, an end portion of the terminal is fixed with the mold.

3. The manufacturing method of an insert case for a semiconductor device according to claim 1, wherein
    a cutout is provided in the terminal, and
    the slide core is inserted into the cutout.

4. The manufacturing method of an insert case for a semiconductor device according to claim 3, wherein a portion of the terminal where the cutout is provided extends to outside of the resin of the insert case.

5. The manufacturing method of an insert case for a semiconductor device according to claim 2, wherein a cutout is provided in the terminal, and
    the slide core is inserted into the cutout.

6. The manufacturing method of an insert case for a semiconductor device according to claim 5, wherein a portion of the terminal where the cutout is provided extends to outside of the resin of the insert case.

7. The manufacturing method of an insert case for a semiconductor device according to claim 1, wherein the mold further comprises:
    a first portion, and
    a second portion,
    the first portion and the second portion are brought together to create the inside of the mold, and
    the slide core is spaced from an interface formed by the first and second portions when brought together.

8. The manufacturing method of an insert case for a semiconductor device according to claim 1, wherein the terminal placed inside the mold has a bend.

9. The manufacturing method of an insert case for a semiconductor device according to claim 8, wherein the mold includes an upper portion and a lower portion, and the slide core moves laterally in a horizontal direction with respect to the upper portion and the lower portion when bringing the slide core into contact with the central portion of the terminal.

10. The manufacturing method of an insert case for a semiconductor device according to claim 8, further comprising placing an other terminal inside the mold and fixing a central portion of the other terminal by bringing an other slide core into contact with the central portion of the other terminal, wherein
    the slide core and the other slide core move in opposite directions when being brought into contact respectively with the central portion of the terminal and the central portion of the other terminal.

11. The manufacturing method of an insert case for a semiconductor device according to claim 1, further comprising placing an other terminal inside the mold and fixing a central portion of the other terminal by bringing an other slide core into contact with the central portion of the other terminal, wherein
    the slide core and the other slide core move in opposite directions when being brought into contact respectively with the central portion of the terminal and the central portion of the other terminal.

12. A manufacturing method of an insert case for a semiconductor device comprising:
    placing a terminal inside a mold and fixing a central portion of the terminal by bringing a slide core into contact with the central portion of the terminal;
    with the central portion of the terminal fixed by the slide core, filling an inside of the mold with resin to mold an insert case to embed a portion of the slide core in the molded insert case; and
    separating the slide core from the terminal and the case and taking out the insert case from the mold, wherein
    the terminal includes a plurality of terminals arranged in parallel to each other, and the slide core is inserted between the adjacent terminals, and
    the mold includes an upper portion and a lower portion, and the slide core moves laterally with respect to the upper portion and the lower portion when bringing the slide core into contact with the central portion of the terminal.

13. The manufacturing method of an insert case for a semiconductor device according to claim 12, further comprising placing an other terminal inside the mold and fixing a central portion of the other terminal by bringing an other slide core into contact with the central portion of the other terminal, wherein
    the slide core and the other slide core move in opposite directions when being brought into contact respectively with the central portion of the terminal and the central portion of the other terminal.

* * * * *